(12) United States Patent
Furumoto et al.

(10) Patent No.: US 8,915,479 B2
(45) Date of Patent: Dec. 23, 2014

(54) ANTI-VIBRATION APPARATUS

(75) Inventors: Mitsuhiro Furumoto, Takasaki (JP); Tosiya Asano, Utsunomiya (JP); Keiji Emoto, Saitama (JP)

(73) Assignee: Canon Kabushiki Kaisha (JP)

( * ) Notice: Subject to any disclaimer, the term of this patent is extended or adjusted under 35 U.S.C. 154(b) by 236 days.

(21) Appl. No.: 13/569,220

(22) Filed: Aug. 8, 2012

(65) Prior Publication Data
US 2013/0037687 A1 Feb. 14, 2013

(30) Foreign Application Priority Data

Aug. 9, 2011 (JP) ................................. 2011-174257
Jul. 31, 2012 (JP) ................................. 2012-170384

(51) Int. Cl.
*F16M 13/00* (2006.01)
*F16F 15/00* (2006.01)

(52) U.S. Cl.
CPC ....... *F16F 15/002* (2013.01); *H01J 2237/0216* (2013.01); *G06F 7/709* (2013.01)
USPC ...... 248/550; 248/638; 188/287; 267/140.14; 267/64.28

(58) Field of Classification Search
CPC ........... F16F 7/00; F16F 15/02; F16F 15/002; H02K 5/24; G03F 7/709; H01J 2237/0216
USPC ................. 248/550, 560, 575, 618, 636, 638; 188/287; 267/140.14, 64.28
See application file for complete search history.

(56) References Cited

U.S. PATENT DOCUMENTS

| | | | | |
|---|---|---|---|---|
| 5,285,995 A * | 2/1994 | Gonzalez et al. | ............. | 248/550 |
| 6,021,991 A * | 2/2000 | Mayama et al. | ............. | 248/550 |
| 6,771,354 B2 * | 8/2004 | Kato | ............... | 355/72 |
| 7,213,690 B2 * | 5/2007 | Tanner | .......... | 188/287 |
| 8,730,451 B2 * | 5/2014 | Butler et al. | .................. | 355/53 |
| 2013/0044306 A1 * | 2/2013 | Emoto et al. | ................... | 355/72 |

FOREIGN PATENT DOCUMENTS

| | | |
|---|---|---|
| JP | 9-190957 A | 7/1997 |
| JP | 10-116120 A | 5/1998 |
| JP | 10-169701 A | 6/1998 |
| JP | 10-259851 A | 9/1998 |
| JP | 11-193847 A | 7/1999 |
| JP | 2003-130128 A | 5/2003 |

OTHER PUBLICATIONS

Office Action issued in counterpart Korean Patent Application No. 10-2012-0086697, dated Jul. 11, 2014.

* cited by examiner

*Primary Examiner* — Anita M King
(74) *Attorney, Agent, or Firm* — Rossi, Kimms & McDowell LLP (57) ABSTRACT

The present invention provides an anti-vibration apparatus including an anti-vibration base, a plurality of supporting mechanisms configured to support the anti-vibration base, a plurality of actuators configured to apply a force to the anti-vibration base, an obtaining unit configured to obtain vibration data which represents vibrations on the anti-vibration base, a first calculation unit configured to calculate, based on the vibration data obtained by the obtaining unit, a force to be applied to the anti-vibration base so as to reduce the vibrations on the anti-vibration base, and a distribution unit configured to distribute the force calculated by the first calculation unit to forces to be applied by the plurality of actuators to the anti-vibration base.

8 Claims, 6 Drawing Sheets

ANTI-VIBRATION APPARATUS

BACKGROUND OF THE INVENTION

1. Field of the Invention

The present invention relates to an anti-vibration apparatus.

2. Description of the Related Art

Along with the progress of precision enhancement of precision apparatuses such as electron microscopes and semiconductor exposure apparatuses, requirements for anti-vibration performance incorporated in these precision apparatuses become stricter. Hence, in order to improve the anti-vibration performance, an anti-vibration apparatus which compensates for vibrations of an installation base on which the anti-vibration apparatus is installed and feedforward-controls a force to be applied to an anti-vibration base has been proposed in Japanese Patent Laid-Open Nos. 2003-130128, 9-190957, 10-116120, and 10-169701.

Figure 4:
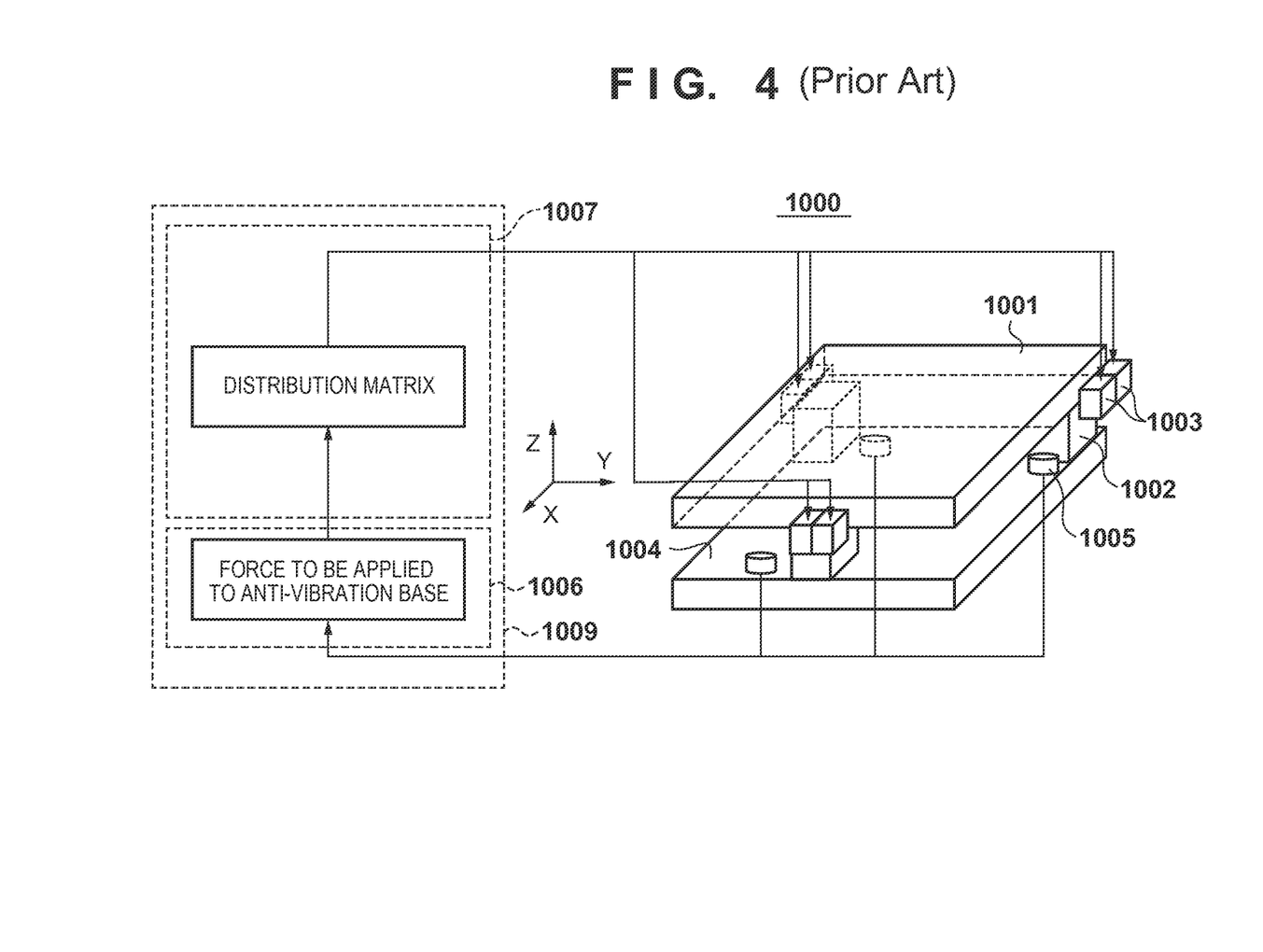
FIG. 4 is a view showing the arrangement of a conventional anti-vibration apparatus.

FIG. 4 shows the arrangement of a conventional anti-vibration apparatus 1000. The anti-vibration apparatus 1000 includes an anti-vibration base 1001, a plurality of supporting mechanisms 1002 which support the anti-vibration base 1001, and a plurality of actuators 1003 which apply forces (control forces) to the anti-vibration base 1001. The number of actuators 1003 to be laid out is determined so as to be able to drive the anti-vibration base 1001 in six-axis directions (three axes of horizontal, vertical, and translational directions, and three axes of rotational directions about the respective axes) in terms of a layout space and cost. The anti-vibration apparatus 1000 includes a detection unit 1005 which detects vibrations of an installation base 1004, and a control unit 1009 including a calculation unit 1006 and distribution unit 1007. The calculation unit 1006 estimates vibrations transmitted to the anti-vibration base 1001 via the supporting mechanisms 1002 based on a detection result of the detection unit 1005, and calculates a force required to cancel these vibrations (a force to be applied to the anti-vibration base 1001). The distribution unit 1007 distributes the force calculated by the calculation unit 1006 into forces respectively applied by the actuators 1003 to the anti-vibration base 1001. In this way, the anti-vibration apparatus 100 improves the anti-vibration performance by feedforward-controlling the respective actuators 1003 so as to cancel vibrations transmitted from the installation base 1004 to the anti-vibration base 1001.

Japanese Patent Laid-Open No. 2003-130128 discloses a technique which allows to separately detect vibrations (behaviors) of the installation base as rigid body motion components and elastic deformation components in association with the arrangement and layout of the detection unit which detects vibrations of the installation base. Then, a force to be applied to the supporting mechanisms, which support the anti-vibration base, is calculated from the detection result of the detection unit, thereby calculating the force required for anti-vibration.

Japanese Patent Laid-Open No. 9-190957 discloses a technique associated with a distribution matrix (distribution ratio) required to distribute a force required to cancel vibrations transmitted to the anti-vibration base to the respective actuators. In Japanese Patent Laid-Open No. 9-190957, the distribution matrix is determined based on the relationship among the barycentric position of the anti-vibration base, the layout of the actuators, and directions of forces applied by the actuators to the anti-vibration base.

However, it becomes difficult for the conventional anti-vibration apparatus to attain high anti-vibration performance required for recent precision apparatuses. For example, the technique of Japanese Patent Laid-Open No. 9-190957 uses the distribution matrix determined based on the relationship among the barycentric position of the anti-vibration base, the layout of the actuators, and the directions of forces applied by the actuators to the anti-vibration base, that is, inertia information, and does not consider any rigidity information of the supporting mechanisms which support the anti-vibration base. Even when the force required to cancel vibrations transmitted to the anti-vibration base is distributed to the respective actuators using only such distribution matrix, sufficient anti-vibration performance cannot be obtained.

Japanese Patent Laid-Open No. 10-116120 discloses a technique for determining the distribution matrix in consideration of rigidity information of the supporting mechanisms which support the anti-vibration base. However, Japanese Patent Laid-Open No. 10-116120 does not disclose how to consider the rigidity information of the supporting mechanisms, that is, a distribution matrix which considers the rigidity information of the supporting mechanisms.

Japanese Patent Laid-Open No. 10-169701 discloses a technique for detecting forces acting on the respective supporting mechanisms which support the anti-vibration base in three directions (horizontal, vertical, and translational directions), and laying out a large number of actuators so as to apply forces to the anti-vibration base in directions opposite to these forces. However, since the anti-vibration apparatus is required to reduce the number of actuators as much as possible in terms of a layout space and cost, it is difficult to apply this technique to an actual anti-vibration apparatus.

SUMMARY OF THE INVENTION

The present invention provides a technique advantageous for realization of high anti-vibration performance.

According to one aspect of the present invention, there is provided an anti-vibration apparatus comprising: an anti-vibration base; a plurality of supporting mechanisms configured to support the anti-vibration base; a plurality of actuators configured to apply a force to the anti-vibration base; an obtaining unit configured to obtain vibration data which represents vibrations on the anti-vibration base; a first calculation unit configured to calculate, based on the vibration data obtained by the obtaining unit, a force to be applied to the anti-vibration base so as to reduce the vibrations on the anti-vibration base; and a distribution unit configured to distribute the force calculated by the first calculation unit to forces to be applied by the plurality of actuators to the anti-vibration base, wherein the distribution unit includes: a separation unit configured to separate the force calculated by the first calculation unit into a first force including only force components in a first frequency band and a second force including only force components in a second frequency band lower than the first frequency band; and a second calculation unit which has, for respective frequency bands, distribution ratios required to distribute the force calculated by the first calculation unit to the plurality of actuators and is configured to calculate the force to be applied by each of the plurality of actuators to the anti-vibration base by adding a result obtained by multiplying the first force by a first distribution ratio of the distribution ratios and a result obtained by multiplying the second force by a second distribution ratio different from the first distribution ratio.

Further aspects of the present invention will become apparent from the following description of exemplary embodiments with reference to the attached drawings.

DESCRIPTION OF THE EMBODIMENTS

Preferred embodiments of the present invention will be described below with reference to the accompanying drawings. Note that the same reference numerals denote the same members throughout the drawings, and a repetitive description thereof will not be given.

The present inventors have extensively examined necessity about consideration of rigidity information of supporting mechanisms which support an anti-vibration base upon distributing, to respective actuators, a force to be applied to the anti-vibration base so as to reduce (cancel) vibrations on the anti-vibration base.

Figure 3A:
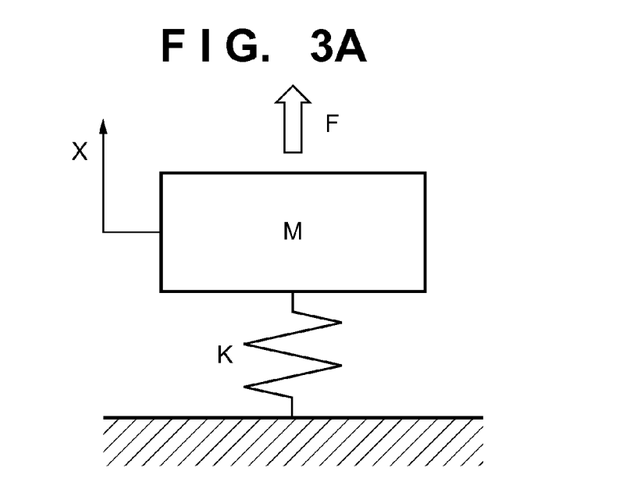
FIGS. 3A and 3B are views for explaining necessity about consideration of rigidity information of supporting mechanisms which support an anti-vibration base.
Figure 3B:
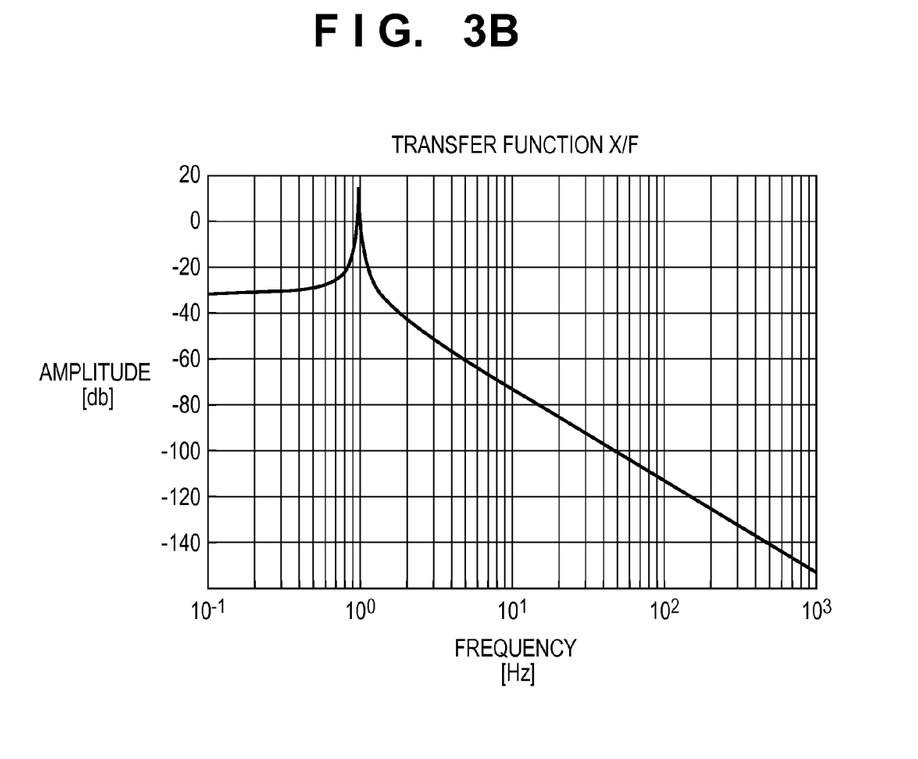

FIG. 3A shows a state in which a force F is applied to a simple single-degree-of-freedom system including a mass M (inertia) and spring K (rigidity). FIG. 3B shows a transfer function of [displacement X/force F] calculated from an equation of motion given by $MX''+KX=F$ in the state shown in FIG. 3A. This transfer function is expressed by $1/(Ms^2+K)$. Referring to FIG. 3B, a frequency corresponding to a peak of an amplitude is an eigenfrequency (1 Hz), and a state of the transfer function changes to have the eigenfrequency as a boundary.

In a frequency band including frequencies higher than the eigenfrequency (high-frequency band), the amplitude of the spring K is small, and the motion velocity of the mass M is high. In other words, in the high-frequency band, the equation of motion can be approximated by $MX''=F$, and the transfer function can be expressed by $1/Ms^2$. On the other hand, in a frequency band including frequencies lower than the eigenfrequency (low-frequency band), the amplitude of the spring K is large, and the motion velocity of the mass M is low. In other words, in the low-frequency band, the equation of motion can be approximated by $KX=F$, and the transfer function can be expressed by $1/K$.

Therefore, whether the inertia or rigidity is dominant in the motion of an object has to be considered depending on the frequency of a force to be applied to the object, and a force has to be distributed based on appropriate information. Since the related arts represented by Japanese Patent Laid-Open No. 9-190957 use only a distribution matrix determined based on inertia information, as described above, the force in the low-frequency band in which the rigidity is dominant is also distributed based on the inertia information. As a result, the related arts have a low anti-vibration effect for vibrations in the low-frequency band, and cannot obtain sufficient anti-vibration performance.

Hence, this embodiment uses a distribution matrix determined from the rigidity information for a frequency band lower than an eigenfrequency of supporting mechanisms which support an anti-vibration base, and a distribution matrix determined from inertia information for a frequency band higher than that eigenfrequency.

Figure 1A:
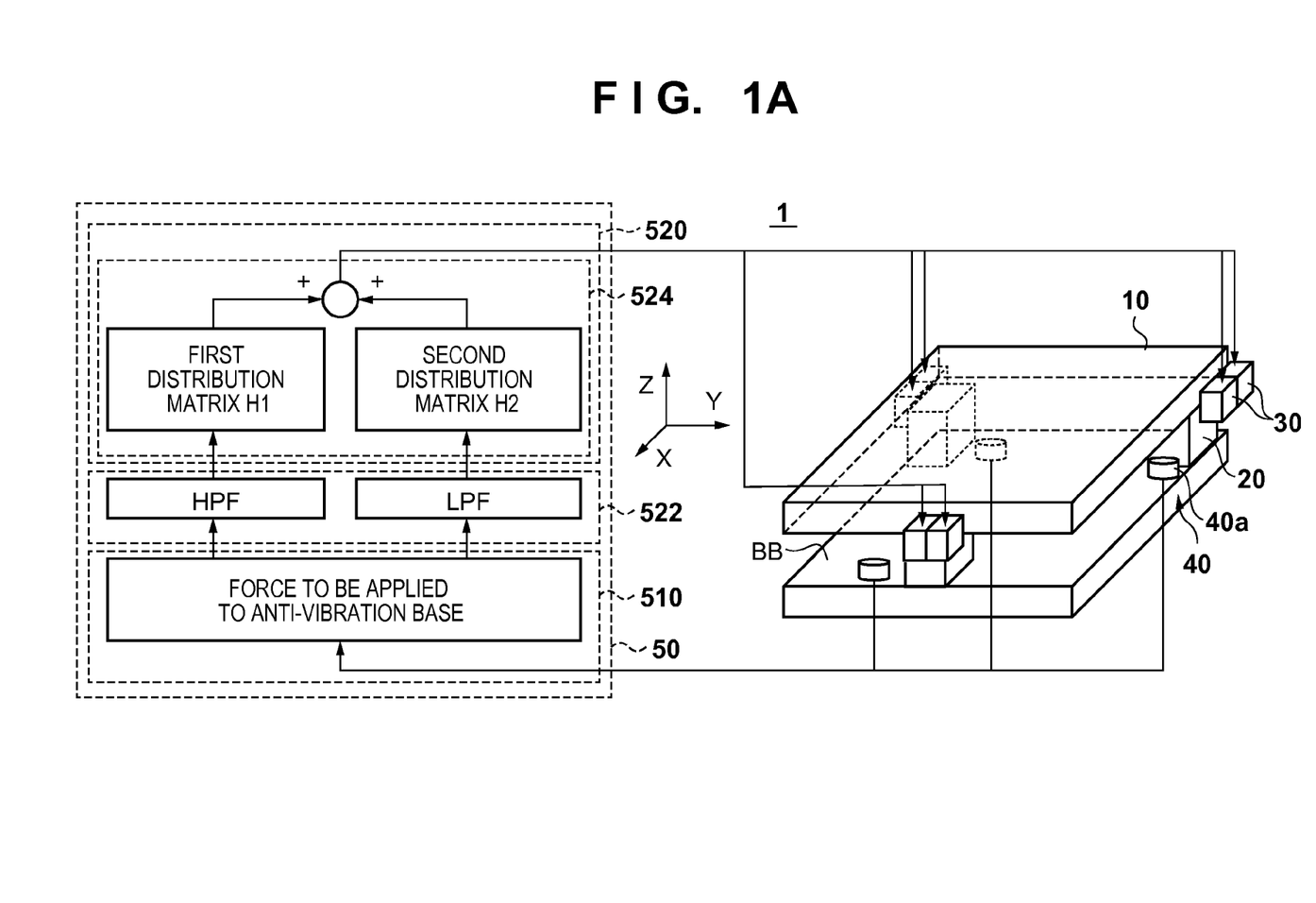
FIGS. 1A to 1C are views showing the arrangement of an anti-vibration apparatus according to one aspect of the present invention.

FIG. 1A shows the arrangement of an anti-vibration apparatus 1 according to one aspect of the present invention. The anti-vibration apparatus 1 is applied to a precision apparatus such as an electron microscope or semiconductor exposure apparatus, and is used to suppress (prevent) an anti-vibration base (or members placed on it) from vibrating. The anti-vibration apparatus 1 includes an anti-vibration base 10, a plurality of supporting mechanisms 20 which support the anti-vibration base 10, a plurality of actuators 30 which apply forces to the anti-vibration base 10, an obtaining unit 40 which obtains vibration data representing vibrations on the anti-vibration base 10, and a control unit 50 which controls the overall anti-vibration apparatus 1.

The number of actuators 30 to be laid out is determined so as to be able to apply forces in six directions (three directions, that is, horizontal, vertical, and translational directions, and three directions, that is, rotational directions about the respective axes) to the anti-vibration base 10 in term of a layout space and cost. The actuators 30 apply forces to the anti-vibration base 10 under the control of the control unit 50 (based on a calculation result of a second calculation unit 524).

The obtaining unit 40 includes at least one of a detection unit (first detection unit) which obtains vibration data by detecting vibrations on the anti-vibration base 10 and a detection unit (second detection unit) which obtains vibration data by detecting vibrations of an installation base BB on which the anti-vibration base 10 is installed. In FIG. 1A, as the obtaining unit 40, a detection unit 40a is configured to include an acceleration meter, velocimeter, displacement gauge, force detection meter, and the like, and to detect vibrations of the installation base BB.

In this embodiment, the control unit 50 is configured by a first calculation unit 510 and a distribution unit 520 including a separation unit 522 and second calculation unit 524. The first calculation unit 510 calculates a force to be applied to the anti-vibration base 10 so as to reduce (ideally, to cancel) vibrations on the anti-vibration base 10 based on the vibration data obtained by the obtaining unit 40. In FIG. 1A, since the detection unit 40a as the obtaining unit 40 detects vibrations of the installation base BB, vibrations (of the anti-vibration base 10), which are transmitted to the anti-vibration base 10 via the supporting mechanisms 20, have to be estimated based on the vibrations of the installation base BB. Such estimation may be made either by the first calculation unit 510 or detection unit 40a.

The distribution unit 520 distributes the force calculated by the first calculation unit 510 into forces which are applied by the plurality of actuators 30 to the anti-vibration base 10. The separation unit 522 includes a high-pass filter HPF and low-pass filter LPF, and separates the force calculated by the first calculation unit 510 into a first force including only force components in a first frequency band and a second force including only force components in a second frequency band lower than the first frequency band. More specifically, the separation unit 522 loads the force calculated by the first calculation unit 510 via two routes, and filters the loaded force using the high-pass filter HPF or low-pass filter LPF. The force calculated by the first calculation unit 510 is converted into a force (first force) including only force components in the high-frequency band (that is, first frequency band) when it is filtered by the high-pass filter HPF to cut force components in the low-frequency band. Also, the force calculated by the first calculation unit 510 is converted into a force (second force) including only force components in the low-frequency band (that is, second frequency band) when it is filtered by the low-pass filter LPF to cut force components in the high-frequency band. Therefore, the force calculated by the first calculation unit 510 is separated by the separation unit 522 into the force which includes only force components in the high-frequency band and that which includes only force components in the low-frequency band.

In this case, it is ideal to set the cutoff frequency of each of the high-pass filter HPF and low-pass filter LPF to match the eigenfrequency of the supporting mechanisms 20, but the cutoff frequency need only be set in a predetermined frequency band including the eigenfrequency of the supporting mechanisms 20. In other words, the cutoff frequency need only be set, so that the first frequency band corresponds to a frequency band including frequencies higher than the eigenfrequency of the supporting mechanisms 20, and the second frequency band corresponds to a frequency band including frequencies lower than the eigenfrequency of the supporting mechanisms 20.

The second calculation unit 524 has distribution matrices (distribution ratios) required to distribute the force calculated by the first calculation unit 510 to the plurality of actuators 30 for the respective frequency bands. In this embodiment, the second calculation unit 524 has a first distribution matrix (first distribution ratio) H1 required to distribute the force including only force components in the high-frequency band and a second distribution matrix (second distribution ratio) H2 required to distribute the force including only force components in the low-frequency band. Then, the second calculation unit 524 adds up a result obtained by multiplying the force including only force components in the high-frequency band by the first distribution matrix H1 and that obtained by multiplying the force including only force components in the low-frequency band by the second distribution matrix H2. Thus, the second calculation unit 524 calculates a force to be applied by each of the plurality of actuators 30 to the anti-vibration base 10.

The first distribution matrix is determined based on inertia information, that is, the relationship among the layout of the plurality of actuators 30, the barycentric position of the anti-vibration base 10, and the directions of forces to be applied by the plurality of actuators 30 to the anti-vibration base 10. On the other hand, the second distribution matrix is determined based on rigidity information, that is, the relationship among the layout of the plurality of actuators 30, the layout and rigidity of the plurality of supporting mechanisms 20, and the directions of forces to be applied by the plurality of actuators 30 to the anti-vibration base 10.

Alternatively, the first and second distribution matrices H1 and H2 may be determined based on vibration data obtained by the obtaining unit 40 when one of the plurality of actuators 30 applies a force in one direction to the anti-vibration base 10.

For example, the first distribution matrix H1 is determined as follows. One of the plurality of actuators 30 applies a force of a frequency equal to or higher than the eigenfrequency of the supporting mechanisms 20 (that is, high frequency) to the anti-vibration base 10. Thus, the motion of the anti-vibration base 10 can be set in an inertia-dominant state. In this case, let F1 be a force applied by the actuator to the anti-vibration base 10, and A1 be a response vector of the anti-vibration base 10 upon application of the force F1. For example, the response vector A1 may include barycentric displacements of the anti-vibration base 10 arranged as a vector, as given by:

$$A1 = \begin{bmatrix} X1 \\ Y1 \\ Z1 \\ \theta x1 \\ \theta y1 \\ \theta z1 \end{bmatrix} \quad (1)$$

By applying such processing to all of the plurality of actuators 30, response vectors An (n: the number of actuators 30) of the anti-vibration base 10 to forces Fn to be applied by the respective actuators to the anti-vibration base 10 are given. Letting h1 be a matrix of such response vectors An, a response AA of the anti-vibration base when the respective actuators apply forces to the anti-vibration base 10 is expressed by:

$$AA = \begin{bmatrix} X \\ Y \\ Z \\ \theta x \\ \theta y \\ \theta z \end{bmatrix} = \begin{bmatrix} X1 & X2 & \dots & Xn \\ Y1 & Y2 & & Yn \\ Z1 & Z2 & \dots & Zn \\ \theta x1 & \theta x2 & \dots & \theta xn \\ \theta y1 & \theta y2 & & \theta yn \\ \theta z1 & \theta z2 & & \theta zn \end{bmatrix} \begin{bmatrix} F1 \\ F2 \\ \dots \\ \dots \\ \dots \\ Fn \end{bmatrix} = h1 \begin{bmatrix} F1 \\ F2 \\ \dots \\ \dots \\ \dots \\ Fn \end{bmatrix} \quad (2)$$

The first distribution matrix H1 indicates a distribution ratio required to distribute the force to be applied by the respective actuators to the anti-vibration base 10 upon moving the anti-vibration base 10 by AA. Therefore, the first distribution matrix H1 can be calculated as an inverse matrix of h1, as given by:

$$\begin{bmatrix} X \\ Y \\ Z \\ \theta x \\ \theta y \\ \theta z \end{bmatrix} = h1 \begin{bmatrix} F1 \\ F2 \\ \dots \\ \dots \\ \dots \\ Fn \end{bmatrix} \quad (3)$$

$$(h1)^{-1} \begin{bmatrix} X \\ Y \\ Z \\ \theta x \\ \theta y \\ \theta z \end{bmatrix} = \begin{bmatrix} F1 \\ F2 \\ \dots \\ \dots \\ \dots \\ Fn \end{bmatrix}$$

$$H1 = (h1)^{-1}$$

Also, the second distribution matrix H2 is determined in the same manner as in the first distribution matrix H1. Upon determining the second distribution matrix H2, one of the plurality of actuators 30 applies a force of a frequency lower than the eigenfrequency of the supporting mechanisms 20 (that is, low frequency) to the anti-vibration base 10. For example, the actuator may be step-driven to set the motion of the anti-vibration base 10 in a rigidity-dominant state, and displacements of the anti-vibration base 10 in a balanced state may be arranged in a matrix.

In this manner, the distribution unit 520 distributes the force which is filtered by the high-pass filter HPF and includes only force components in the high-frequency band to the respective actuators using the first distribution matrix H1. Also, the distribution unit 520 distributes the force which is filtered by the low-pass filter LPF and includes only force components in the low-frequency band to the respective actuators using the second distribution matrix H2. In this way, the force (which is to be applied to the anti-vibration base 10 so as to reduce vibrations on the anti-vibration base 10) calculated by the first calculation unit 510 can be distributed according to the frequencies. Therefore, the anti-vibration apparatus 1 can realize high anti-vibration performance.

Figure 1B:
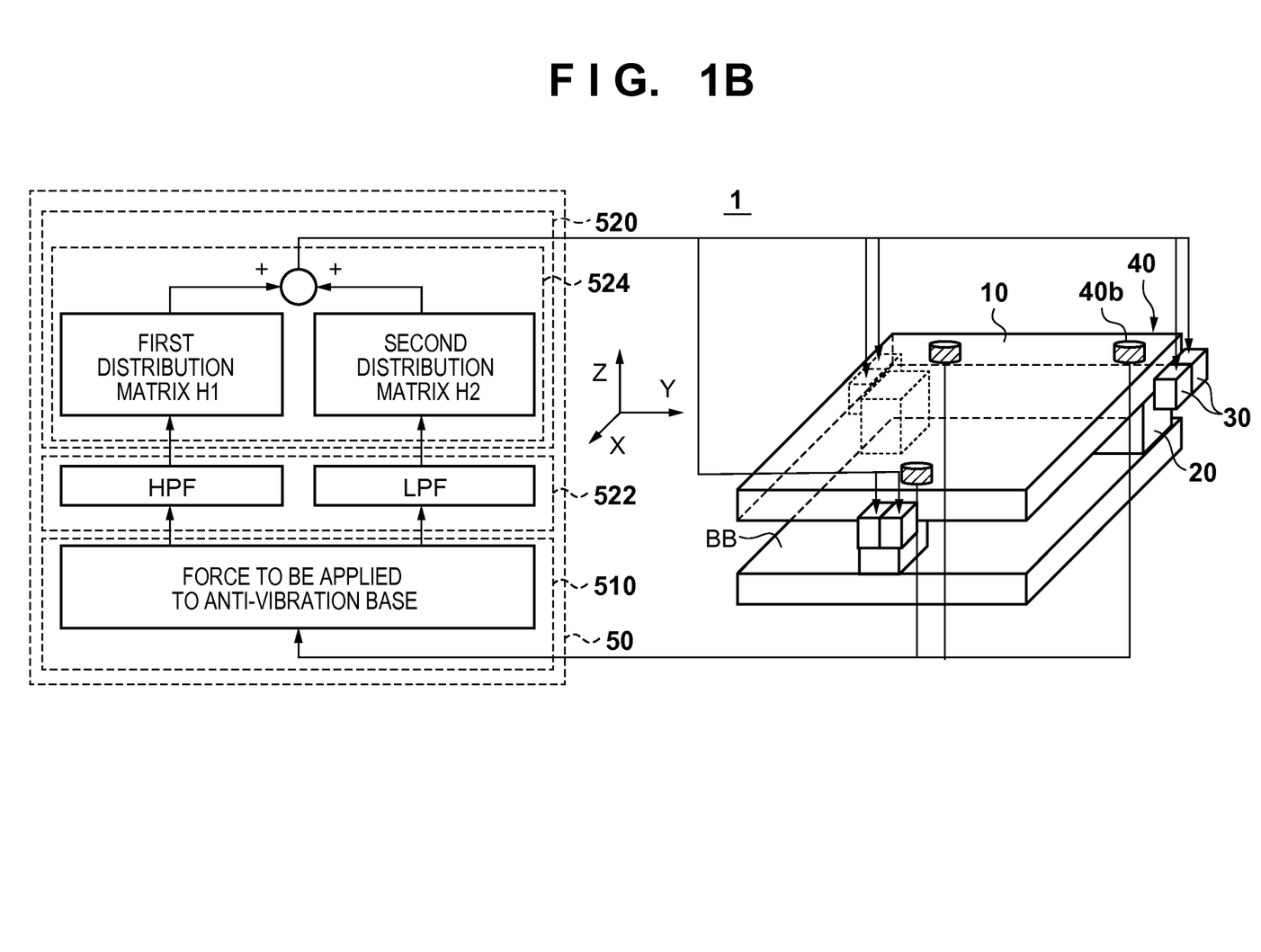
Figure 1C:
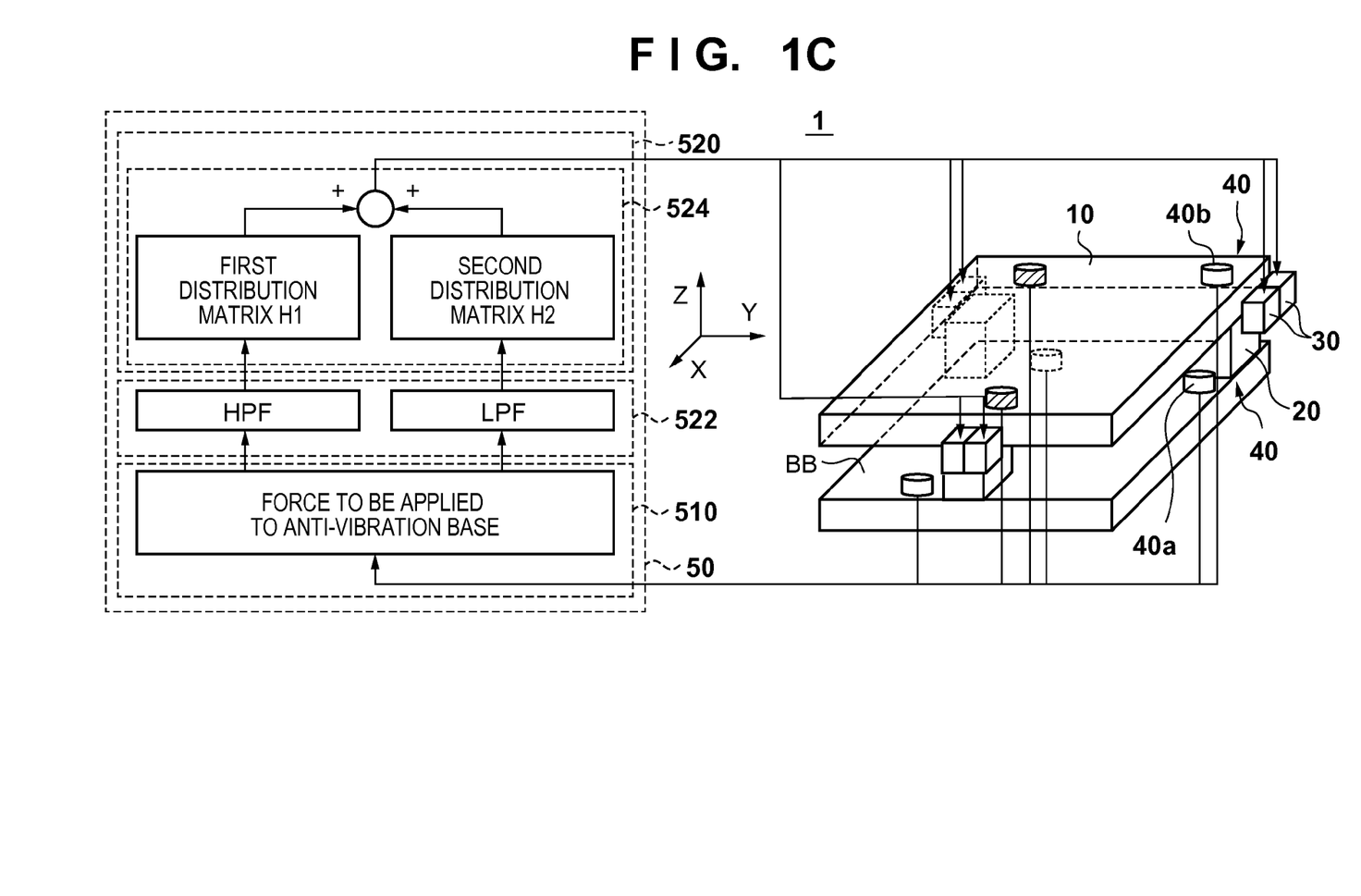

In FIG. 1A, the control unit 50 feedforward-controls the actuators 30 (that is, driving operations of the actuators 30) so as to reduce vibrations on the anti-vibration base 10, which are estimated from those of the installation base BB. However, as shown in FIG. 1B, as the obtaining unit 40, a detection unit 40b which detects vibrations on the anti-vibration base 10 may be configured, and the control unit 50 may feedback-control the actuators 30 so as to reduce vibrations detected by the detection unit 40b. Alternatively, as shown in FIG. 1C, as the obtaining unit 40, both the detection unit 40a which detects vibrations of the installation base BB and the detection unit 40b which detects vibrations on the anti-vibration base 10 may be configured so as to execute feedforward control and feedback control of the actuators 30. In this way, the anti-vibration apparatus can further improve the anti-vibration performance.

Figure 2:
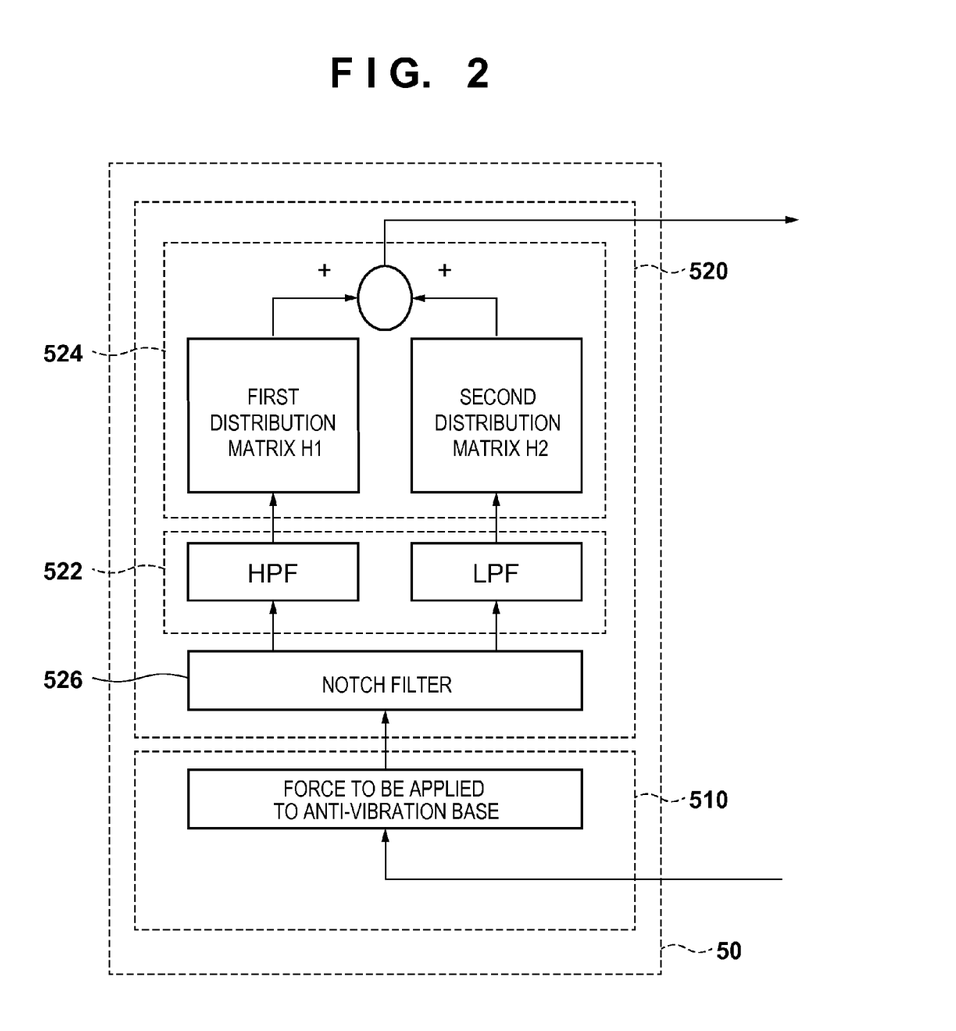
FIG. 2 is a block diagram showing another arrangement of a control unit in the anti-vibration apparatus shown in FIGS. 1A to 1C.

Also, as shown in FIG. 2, the distribution unit 520 may include a notch filter 526 at a position before the separation unit 522 (before the force calculated by the first calculation unit 510 is separated), that is, at a position between the first calculation unit 510 and separation unit 522. The cutoff frequency of the notch filter 526 is set to be the eigenfrequency of the supporting mechanisms 20 and the notch filter 526 reduces force components at the eigenfrequency of the supporting mechanisms 20. Thus, the anti-vibration base 10 can be prevented from resonating upon application of the forces by the actuators 30 to the anti-vibration base 10. In this embodiment, a pneumatic spring is used as each supporting mechanism 20. The pneumatic spring supports the anti-vibration base 10 at an eigenfrequency as low as several Hz to several ten Hz. Also, a sensor (not shown) which measures a displacement of the anti-vibration base 10 with respect to the installation base BB and an adjuster (not shown) which adjusts a pressure of the pneumatic spring are arranged, and the pressure of the pneumatic spring is adjusted based on the output from the sensor, thereby controlling the position of the anti-vibration base 10.

A control band (frequency band) of a position control system of the anti-vibration base 10 is set to be about 1/10 of the eigenfrequency. Thus, only position variations of the anti-vibration base 10 at very low frequencies with respect to the installation base BB can be reduced. That is, since the anti-vibration base 10 can be suppressed from following vibrations of the installation base BB at frequencies higher than the set control band, a low-rigidity support state of the supporting mechanisms 20 can be maintained.

As each actuator 30, a force actuator is used and, for example, a linear motor using a Lorenz force is used. Since control using the linear motor has higher response than that using the pneumatic spring and adjuster, it is advantageous to suppress vibrations at frequencies higher than the eigenfrequency of the anti-vibration base 10.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2011-174257 filed on Aug. 9, 2011 and 2012-170384 filed on Jul. 31, 2012, which are hereby incorporated by reference herein in their entirety.

What is claimed is:

1. An anti-vibration apparatus comprising:
an anti-vibration base;
a plurality of supporting mechanisms configured to support the anti-vibration base;
a plurality of actuators configured to apply a force to the anti-vibration base;
an obtaining unit configured to obtain vibration data which represents vibrations on the anti-vibration base;
a first calculation unit configured to calculate, based on the vibration data obtained by the obtaining unit, a force to be applied to the anti-vibration base so as to reduce the vibrations on the anti-vibration base; and
a distribution unit configured to distribute the force calculated by the first calculation unit to forces to be applied by the plurality of actuators to the anti-vibration base,
wherein the distribution unit includes:
a separation unit configured to separate the force calculated by the first calculation unit into a first force including only force components in a first frequency band and a second force including only force components in a second frequency band lower than the first frequency band; and
a second calculation unit which has, for respective frequency bands, distribution ratios required to distribute the force calculated by the first calculation unit to the plurality of actuators and is configured to calculate the force to be applied by each of the plurality of actuators to the anti-vibration base by adding a result obtained by multiplying the first force by a first distribution ratio of the distribution ratios and a result obtained by multiplying the second force by a second distribution ratio different from the first distribution ratio.

2. The apparatus according to claim 1, wherein the first distribution ratio is determined based on a relationship among a layout of the plurality of actuators, a barycentric position of the anti-vibration base, and directions of forces to be respectively applied by the plurality of actuators to the anti-vibration base, and
the second distribution ratio is determined based on a relationship among the layout of the plurality of actuators, a layout and rigidity of the plurality of supporting mechanisms, and the directions of the forces to be respectively applied by the plurality of actuators to the anti-vibration base.

3. The apparatus according to claim 1, wherein the obtaining unit includes at least one of a first detection unit configured to obtain the vibration data by detecting vibrations on the anti-vibration base and a second detection unit configured to obtain the vibration data by detecting vibrations of an installation base on which the anti-vibration base is installed.

4. The apparatus according to claim 1, wherein the first frequency band is a frequency band including frequencies higher than an eigenfrequency of the plurality of supporting mechanisms, and
the second frequency band is a frequency band including frequencies lower than the eigenfrequency of the plurality of supporting mechanisms.

5. The apparatus according to claim 4, wherein the distribution unit includes a filter configured to reduce force components at the eigenfrequency between the first calculation unit and the separation unit.

6. The apparatus according to claim 1, wherein the first distribution ratio and the second distribution ratio are determined based on the vibration data obtained by the obtaining unit when one actuator of the plurality of actuators applies a force in one direction to the anti-vibration base.

7. The apparatus according to claim 6, wherein the first distribution ratio is determined based on the vibration data obtained by the obtaining unit when the one actuator applies a force of a frequency not less than an eigenfrequency of the plurality of supporting mechanisms to the anti-vibration base.

8. The apparatus according to claim 6, wherein the second distribution ratio is determined based on the vibration data obtained by the obtaining unit when the one actuator applies a force of a frequency lower than an eigenfrequency of the plurality of supporting mechanisms to the anti-vibration base.

* * * * *